United States Patent
Wu et al.

(10) Patent No.: US 10,615,231 B2
(45) Date of Patent: Apr. 7, 2020

(54) ORGANIC LIGHT EMITTING DIODE SUBSTRATE, METHOD FOR MANUFACTURING THE SAME, AND DISPLAY PANEL

(71) Applicants: BOE TECHNOLOGY GROUP CO., LTD., Beijing (CN); Ordos Yuansheng Optoelectronics Co., Ltd., Inner Mongolia (CN)

(72) Inventors: Haidong Wu, Beijing (CN); Yansong Li, Beijing (CN); Xiaobo Du, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 16/124,084

(22) Filed: Sep. 6, 2018

(65) Prior Publication Data

US 2019/0088728 A1    Mar. 21, 2019

(30) Foreign Application Priority Data

Sep. 20, 2017    (CN) .......................... 2017 1 0852353

(51) Int. Cl.
*H01L 27/32*    (2006.01)
*H01L 51/52*    (2006.01)
(Continued)

(52) U.S. Cl.
CPC ...... *H01L 27/3246* (2013.01); *H01L 51/5036* (2013.01); *H01L 51/5206* (2013.01);
(Continued)

(58) Field of Classification Search
CPC ............. H01L 27/3246; H01L 27/3283; H01L 27/3295; H01L 51/5228
See application file for complete search history.

(56) References Cited

U.S. PATENT DOCUMENTS 6,407,408 B1    6/2002   Zhou et al.
7,663,306 B2    2/2010   Imamura
(Continued)

FOREIGN PATENT DOCUMENTS

CN    1822738    8/2006
CN    1934605    3/2007
(Continued)

OTHER PUBLICATIONS

Office Action from Chinese Application No. CN201710852353.8, dated Oct. 31, 2018, 19 pgs.

*Primary Examiner* — Daniel P Shook
(74) *Attorney, Agent, or Firm* — Westman, Champlin & Koehler, P.A.

(57) ABSTRACT

An organic light emitting diode substrate, a method for manufacturing an organic light emitting diode substrate, and a display panel. The organic light emitting diode substrate includes: a base substrate; a pixel defining layer on the base substrate; and an anode, an organic light emitting diode functional layer and a cathode in a pixel region. The pixel defining layer includes a first pixel defining layer, an auxiliary cathode and a second pixel defining layer sequentially stacked, the auxiliary cathode being connected to the cathode.

18 Claims, 3 Drawing Sheets

(51) Int. Cl.
*H01L 51/56* (2006.01)
*H01L 51/50* (2006.01)

(52) U.S. Cl.
CPC ...... *H01L 51/5221* (2013.01); *H01L 51/5228* (2013.01); *H01L 51/5234* (2013.01); *H01L 51/5237* (2013.01); *H01L 51/56* (2013.01); *H01L 51/504* (2013.01); *H01L 51/5215* (2013.01); *H01L 2251/5315* (2013.01); *H01L 2251/558* (2013.01)

(56) References Cited

U.S. PATENT DOCUMENTS

| | | |
|---|---|---|
| 7,915,814 B2 | 3/2011 | Matsudate et al. |
| 8,310,413 B2 | 11/2012 | Fish et al. |
| 9,111,888 B2 | 8/2015 | Do et al. |
| 9,831,461 B2 | 11/2017 | Song et al. |
| 2005/0007015 A1 | 1/2005 | Yokoyama et al. |
| 2017/0125507 A1* | 5/2017 | Lee .................. H01L 27/3213 |
| 2017/0236853 A1 | 8/2017 | Sagawa |

FOREIGN PATENT DOCUMENTS

| | | |
|---|---|---|
| CN | 101409304 | 4/2009 |
| CN | 104576705 | 4/2015 |
| CN | 104659063 | 5/2015 |
| CN | 104681588 | 6/2015 |
| EP | 1 482 572 | 12/2004 |
| EP | 3 242 325 | 11/2017 |
| JP | 2000-331784 | 11/2000 |
| JP | 2008-135325 | 6/2008 |
| KR | 2003-0026434 | 4/2003 |
| KR | 10-1120142 | 2/2012 |
| KR | 10-2015-0042989 | 4/2015 |

* cited by examiner

US 10,615,231 B2

ORGANIC LIGHT EMITTING DIODE SUBSTRATE, METHOD FOR MANUFACTURING THE SAME, AND DISPLAY PANEL

CROSS-REFERENCE TO RELATED APPLICATION

This application claims the priority benefit of Chinese Patent Application No. 201710852353.8 filed on Sep. 20, 2017 in the State Intellectual Property Office of China, the disclosure of which is incorporated herein by reference in entirety.

BACKGROUND

Technical Field

Embodiments of the present disclosure relate to the field of display technology, and in particular, to an organic light emitting diode substrate, a method for manufacturing an organic light emitting diode substrate, and a display panel.

Description of the Related Art

In the field of display technology, CRT display devices have been gradually replaced by liquid crystal display (LCD) devices and organic light emitting diode (OLED) display devices. Due to high brightness, high color saturation, lightness and thinness, flexibility, low cost and the like of the OLED display device, it is expected to become dominant in the next generation of flat panel display technology after LCD display technology, and it has been one of the most popular technology branches in the flat panel display technology. An active matrix organic light emitting diode (AMOLED) display device is a type of OLED display device and it is mainly composed of thin film transistors (TFTs) and OLEDs.

Depending on the light emitting direction, the OLED substrates can be classified into three types: a bottom-emitting OLED, a top-emitting OLED, and a double-sided emitting OLED. Specifically, the light is emitted from a substrate in the bottom-emitting OLED, the light is emitted from the top in the top-emitting OLED, and the light is emitted from both the substrate and the top simultaneously in the double-sided emitting OLED. Among them, compared with the bottom-emitting OLED, the top-emitting OLED has the advantages of high aperture ratio, high color purity, and easy realization of high resolution (Pixels per inch, PPI), thus the top-emitting OLED has become the current mainstream organic electroluminescent device structure.

For the top-emitting OLED, since the light is emitted from a cathode side, the design of the cathode has a very significant effect on display performance.

SUMMARY

An embodiment of the present disclosure provides an organic light emitting diode substrate, comprising:
a base substrate;
a pixel defining layer on the base substrate; and
an anode, an organic light emitting diode functional layer and a cathode in a pixel region,
wherein the pixel defining layer comprises a first pixel defining layer, an auxiliary cathode and a second pixel defining layer sequentially stacked, the auxiliary cathode being connected to the cathode.

As an alternative embodiment, a thickness of the cathode is less than a thickness of the auxiliary cathode.

As an alternative embodiment, the anode and the auxiliary cathode are formed in one same process.

As an alternative embodiment, the cathode has a thickness of 6 to 10 nm.

As an alternative embodiment, the auxiliary cathode comprises a first transparent electrically conductive layer, a metal layer, and a second transparent electrically conductive layer sequentially stacked.

As an alternative embodiment, the first transparent electrically conductive layer has a thickness of 5 to 20 nm, the metal layer has a thickness of 130 to 170 nm, and the second transparent electrically conductive layer has a thickness of 5 to 20 nm.

As an alternative embodiment, the organic light emitting diode functional layer comprises a red organic light emitting diode functional layer having a thickness of $d_R$, a green organic light emitting diode functional layer having a thickness of $d_G$, and a blue organic light emitting diode functional layer having a thickness of $d_B$, and $d_B > d_{P1} - d_{A1} - d_{A2} - d_{A3} - d_Y$; $d_R < d_{P1}$; $d_R > d_G > d_B$,
where $d_{P1}$ is a thickness of the first pixel defining layer, $d_{A1}$ is a thickness of the first transparent electrically conductive layer, $d_{A2}$ is a thickness of the metal layer, $d_{A3}$ is a thickness of the second transparent electrically conductive layer, and $d_Y$ is a thickness of the cathode.

As an alternative embodiment, the auxiliary cathode is formed from a transparent electrically conductive layer.

As an alternative embodiment, the transparent electrically conductive layer has a thickness of 160 to 170 nm.

As an alternative embodiment, the organic light emitting diode functional layer comprises a red organic light emitting diode functional layer having a thickness of $d_R$, a green organic light emitting diode functional layer having a thickness of $d_G$, and a blue organic light emitting diode functional layer having a thickness of $d_B$, and $d_B > d_{P1} - d_Z - d_Y$; $d_R < d_{P1}$; $d_R > d_G > d_B$,
where $d_{P1}$ is a thickness of the first pixel defining layer, $d_Z$ is a thickness of the transparent electrically conductive layer, and $d_Y$ is a thickness of the cathode.

As an alternative embodiment, the first pixel defining layer has a thickness of 300 to 350 nm, and a slope angle of an edge of the first pixel defining layer and a slope angle of an edge of the second pixel defining layer are 85° to 90°.

An embodiment of the present disclosure provides a display panel, comprising the organic light emitting diode substrate according to the above embodiments.

An embodiment of the present disclosure provides a method for manufacturing an organic light emitting diode substrate, comprising:
forming a first pixel defining layer on a base substrate;
forming an auxiliary cathode on the first pixel defining layer and forming an anode in a pixel region defined by the first pixel defining layer;
forming a second pixel defining layer on the auxiliary cathode; and
forming an organic light emitting diode functional layer and a cathode on the anode, the cathode being connected to the auxiliary cathode.

As an alternative embodiment, the formed cathode has a thickness less than a thickness of the auxiliary cathode.

As an alternative embodiment, the anode and the auxiliary cathode are formed by one same process.

As an alternative embodiment, forming the first pixel defining layer on the base substrate comprises: depositing a pixel defining film on the base substrate; and exposing, developing and etching the pixel defining film to form the first pixel defining layer, and wherein the first pixel defining layer has a thickness of 300 nm to 350 nm, and an edge of the first pixel defining layer has a slope angle of 85° to 90°.

As an alternative embodiment, forming the auxiliary cathode on the first pixel defining layer and forming the anode in the pixel region defined by the first pixel defining layer comprises:

depositing a first transparent electrically conductive layer, a metal layer, and a second transparent electrically conductive layer sequentially on the first pixel defining layer and the pixel region defined by the first pixel defining layer to form the auxiliary cathode on the first pixel defining layer and the anode in the pixel region defined by the first pixel defining layer.

As an alternative embodiment, forming the auxiliary cathode on the first pixel defining layer and forming the anode in the pixel region defined by the first pixel defining layer comprises:

depositing a transparent electrically conductive layer on the first pixel defining layer and the pixel region defined by the first pixel defining layer to form the auxiliary cathode on the first pixel defining layer and the anode in the pixel region defined by the first pixel defining layer.

As an alternative embodiment, forming the organic light emitting diode functional layer and the cathode on the anode comprises:

forming a red organic light emitting diode functional layer having a thickness of $d_R$, a green organic light emitting diode functional layer having a thickness of $d_G$, and a blue organic light emitting diode functional layer having a thickness of $d_B$ respectively on the anode in different pixel regions, and $d_B > d_{P1} - d_{A1} - d_{A2} - d_{A3} - d_Y$; $d_R < d_{P1}$; $d_R > d_G > d_B$, where $d_{P1}$ is a thickness of the first pixel defining layer, $d_{A1}$ is a thickness of the first transparent electrically conductive layer, $d_{A2}$ is a thickness of the metal layer, $d_{A3}$ is a thickness of the second transparent electrically conductive layer, and $d_Y$ is a thickness of the cathode.

As an alternative embodiment, forming the organic light emitting diode functional layer and the cathode on the anode comprises:

forming a red organic light emitting diode functional layer having a thickness of $d_R$, a green organic light emitting diode functional layer having a thickness of $d_G$, and a blue organic light emitting diode functional layer having a thickness of $d_B$ respectively on the anode in different pixel regions, and $d_B > d_{P1} - d_Z - d_Y$; $d_R < d_{P1}$; $d_R > d_G > d_B$, where $d_{P1}$ is a thickness of the first pixel defining layer, $d_Z$ is a thickness of the transparent electrically conductive layer, and $d_Y$ is a thickness of the cathode.

Of course, it is not necessary to have all the above technical features to implement any of the products or methods according to the embodiments of the present disclosure. Other features and advantages of the embodiments of the present disclosure will be set forth with reference to the following embodiments of the specification, and they will be obvious from the description of the embodiments of the specification or be understood through the disclosure of the embodiments of the present disclosure. Objectives and other advantages of the embodiments of the present disclosure can be realized and obtained by the structures particularly set forth in the specification, the claims and the accompanying drawings.

BRIEF DESCRIPTION OF THE DRAWINGS

The drawings are used to provide a further understanding of the embodiments of the present disclosure, and they are provided as a part of the specification and serve for explaining the present disclosure together with the embodiments of the present disclosure, but they are not intended to limit the present disclosure. Shapes and sizes of the various components in the drawings do not reflect their real scale, and they are merely intended to exemplarily illustrate the embodiments of the present disclosure.

DETAILED DESCRIPTION OF EMBODIMENTS

The present disclosure will be further described in detail below with reference to the accompanying drawings and the embodiments. The following embodiments are intended to describe the present disclosure, rather than limit the scope of the present disclosure. It should be noted that the embodiments and the features in the embodiments of the present disclosure may be combined with each other unless they are contradicted.

For the top-emitting OLED, since the light is emitted from a cathode side, the cathode is required to have good light transmittance and electrical conductivity, however it is very difficult to balance the light transmittance and the electrical conductivity. For example, in order to meet requirements on light transmittance, the cathode is necessarily required to be thin, but in this case, the cathode has a relatively large resistance, which not only causes voltage and power consumption to increase, but also causes non-uniform voltage distribution across the cathode, resulting in non-uniform brightness. In order to meet requirements on the conductivity, the cathode is necessarily required to be thick, but in this case, the cathode has a low transmittance, thereby resulting in color shift associated with viewing angle.

Therefore, it is a technical problem to be urgently solved in the art how to simultaneously improve the light transmittance and the electrical conductivity in the structure design of top-emitting OLED. The technical problem to be solved by the embodiments of the present disclosure is to provide an organic light emitting diode substrate, a method for manufacturing an organic light emitting diode substrate, and a display panel to simultaneously improve the light transmittance and the electrical conductivity.

Figure 1:
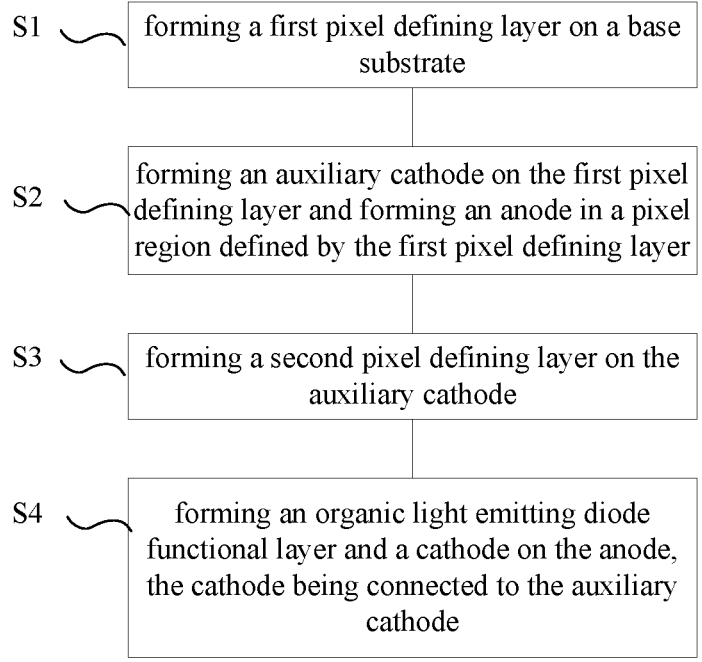
FIG. 1 is a flow chart of a method for manufacturing an organic light emitting diode substrate according to an embodiment of the present disclosure.

In order to simultaneously improve the light transmittance and the electrical conductivity of the top-emitting OLED, an embodiment of the present disclosure provides a method for manufacturing an organic light emitting diode substrate. FIG. 1 is a flow chart of a method for manufacturing an organic light emitting diode substrate according to an embodiment of the present disclosure. As shown in FIG. 1, the method for manufacturing the organic light emitting diode substrate includes:

S1: forming a first pixel defining layer on a base substrate;

S2: forming an auxiliary cathode on the first pixel defining layer and forming an anode in a pixel region defined by the first pixel defining layer;

S3: forming a second pixel defining layer on the auxiliary cathode; and

S4: forming an organic light emitting diode (OLED) functional layer and a cathode on the anode, the cathode being connected to the auxiliary cathode.

The step S1 includes: depositing a pixel defining film on the base substrate; and exposing, developing and etching the pixel defining film to form the first pixel defining layer. The first pixel defining layer has a thickness of 300 nm to 350 nm, and an edge of the first pixel defining layer has a slope angle of 85° to 90°.

In an embodiment, the step S2 includes: sequentially depositing a first transparent electrically conductive layer having a thickness of 5 to 20 nm, a metal layer having a thickness of 130 to 170 nm, and a second transparent electrically conductive layer having a thickness of 5 to 20 nm on the structure obtained in the step S1, so as to form an anode in a pixel region defined by the first pixel defining layer and an auxiliary cathode on the first pixel defining layer. Specifically, the first transparent electrically conductive layer, the metal layer and the second transparent electrically conductive layer deposited in the pixel region serve as the anode, and the first transparent electrically conductive layer, the metal layer and the second transparent electrically conductive layer deposited on the first pixel defining layer serve as the auxiliary cathode.

In another embodiment, the step S2 includes: depositing a transparent electrically conductive layer having a thickness of 160 to 170 nm on the structure obtained in the step S1, so as to form an anode in a pixel region defined by the first pixel defining layer and an auxiliary cathode on the first pixel defining layer.

The step S3 includes: depositing a pixel defining film on the structure obtained in the step S2; and exposing, developing, and etching the pixel defining film to form the second pixel defining layer, wherein an edge of the second pixel defining layer has a slope angle of 85° to 90°, and an orthographic projection of the second pixel defining layer on the base substrate overlaps with an orthographic projection of the first pixel defining layer on the base substrate. Specifically, the second pixel defining layer is formed on the auxiliary cathode.

The step S4 includes:

S41: forming the organic light emitting diode (OLED) functional layer in the pixel region, the organic light emitting diode functional layer including a functional layer and an organic light emitting layer;

S42: forming the cathode on the organic light emitting diode functional layer, the cathode being connected to the auxiliary cathode.

The step S41 includes: sequentially forming a red organic light emitting diode functional layer having a thickness of $d_R$, a green organic light emitting diode functional layer having a thickness of $d_G$, and a blue organic light emitting diode functional layer having a thickness of $d_B$ in different pixel regions; and $d_B > d_{P1} - d_{A1} - d_{A2} - d_{A3} - d_Y$; $d_R < d_{P1}$; $d_R > d_G > d_B$; or $d_B > d_{P1} - d_Z - d_Y$; $d_R < d_{P1}$; $d_R > d_G > d_B$.

where $d_{P1}$ is a thickness of the first pixel defining layer, $d_{A1}$ is a thickness of the first transparent electrically conductive layer, $d_{A2}$ is a thickness of the metal layer, $d_{A3}$ is a thickness of the second transparent electrically conductive layer, $d_Z$ is a thickness of the transparent electrically conductive layer, and $d_Y$ is a thickness of the cathode.

The step S42 includes: forming a cathode having a thickness of 6-10 nm on the organic light emitting diode functional layer, the cathode being connected to the auxiliary cathode.

In the method for manufacturing the organic light emitting diode substrate according to the embodiments of the present disclosure, a relatively thick auxiliary cathode is formed between two pixel defining layers, a relatively thin cathode is formed in the pixel region, and the cathode is connected to the auxiliary cathode. In this way, it not only effectively improves the problem of color shift associated with viewing angle, but also makes voltage distribution of the cathode uniform, thereby resulting in a high brightness uniformity. Since the auxiliary cathode between the two pixel defining layers is thicker, the resistance of the cathode is relatively small, which will not cause voltage and power consumption to increase, and it contributes to a uniform voltage distribution across the cathode, thereby avoiding the non-uniform brightness. In addition, since the thicker auxiliary cathode is located between the two pixel defining layers, it does not raise a requirement on light transmittance at that position. Since the cathode formed in the pixel region is thinner, the light transmittance is good, thereby avoiding color shift associated with viewing angle.

An embodiment of the present disclosure will be further described below with reference to the manufacturing processes of the organic light emitting diode substrate. The "patterning process" in this embodiment includes a process of depositing a film layer, coating a photoresist, exposing with a mask, developing, etching, stripping a photoresist, and the like, which are known developed manufacturing processes. The depositing may be carried out by a known process such as sputtering, evaporation, or chemical vapor deposition, the coating may be carried out by a known coating process, and the etching may be carried out by a known method. They will not be specifically limited herein.

FIGS. 2 to 7 are schematic views of structures formed in the method for manufacturing the organic light emitting diode substrate according to an embodiment of the present disclosure. The method for manufacturing the organic light emitting diode substrate according to this embodiment will be described in detail below with reference to FIGS. 2 to 7.

(1) A pattern of a driving structure layer 12 is formed on a base substrate 11 by a patterning process. In this embodiment, the driving structure layer 12 includes Thin Film Transistors (TFTs), and the structure and the manufacturing process of the driving structure layer are the same as the known manufacturing process. For example, the manufacturing process may include: cleaning the base substrate firstly, and then sequentially manufacturing a gate electrode, an insulating layer, an active layer, a source electrode, a drain electrode, and a planarization layer on the base substrate by patterning processes. The material of the base substrate may be selected from glass, quartz, polyethylene terephthalate (PET) or a polymeric soft film undergoing a surface treatment, etc. The thin film transistor may be of a bottom gate structure or a top gate structure, it may be an amorphous silicon (a-Si) thin film transistor, or a low temperature polysilicon (LTPS) thin film transistor or an oxide thin film transistor, which is not specifically limited herein.

Figure 2:
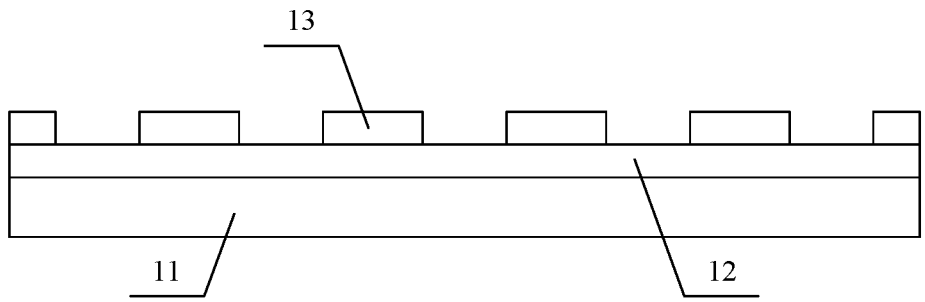
FIG. 2 is a schematic view of a structure with a pattern of a first pixel defining layer formed in a method for manufacturing an organic light emitting diode substrate according to an embodiment of the present disclosure.

(2) A pattern of a first pixel defining layer is formed on the base substrate on which the aforementioned pattern has been formed. Forming the pattern of the first pixel defining layer includes: depositing a pixel defining film on the base substrate on which the aforementioned pattern is formed, exposing and developing the pixel defining film by using a monotone mask, and etching the pixel defining film to form a first pixel defining layer 13, an edge of the pattern of the pixel defining layer 13 having a slope angle of 85° to 90°, as shown in FIG. 2. The pattern of the first pixel defining layer 13 is used to define a plurality of pixel regions exposing light emitting regions. In this embodiment, the slope angle of the edge of the pattern of the first pixel defining layer refers to an included angle between the edge of the pattern of the first pixel defining layer and the base substrate.

In this embodiment, the pixel defining film may be made from polyimide, acrylic or polyethylene terephthalate by chemical vapor deposition (CVD), and the formed first pixel defining layer 13 may have a thickness $d_{P1}$ of 300 nm to 350 nm. As an example, the thickness $d_{P1}$ of the first pixel defining layer 13 is 330 nm. After exposing and developing, a dry etching process may be adopted. Due to high etching precision of the dry etching process, the slope angle of the edge of the pattern of the first pixel defining layer may be controlled.

Figure 3:
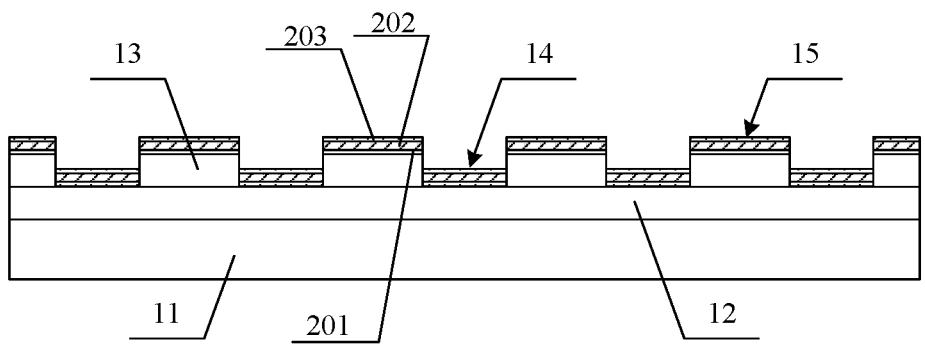
FIG. 3 is a schematic view of a structure with patterns of an anode and an auxiliary cathode formed in a method for manufacturing an organic light emitting diode substrate according to an embodiment of the present disclosure.

(3) Patterns of an anode and an auxiliary cathode are formed on the base substrate on which the aforementioned patterns have been formed. Forming the patterns of the anode and the auxiliary cathode includes: sequentially depositing a first transparent electrically conductive layer 201, a metal layer 202, and a second transparent electrically conductive layer 203 on the base substrate on which the aforementioned patterns are formed, forming the pattern of the anode 14 in the pixel region defined by the first pixel defining layer 13, forming the pattern of the auxiliary cathode 15 on the first pixel defining layer 13, as shown in FIG. 3. The anode 14 and the auxiliary cathode 15 are in the same structural layer, including the first transparent electrically conductive layer 201, the metal layer 202, and the second transparent electrically conductive layer 203 which are sequentially stacked.

The included angle between a surface of the pattern of the first pixel defining layer 13 and the edge of the pattern of the first pixel defining layer is close to a right angle when the pattern of the first pixel defining layer 13 is formed. That is, a edge contour of the first pixel defining layer is almost perpendicular to an upper surface thereof and the base substrate. Therefore, the deposited transparent electrically conductive layer and metal layer are broken at the edge of the pixel defining layer, so that the electrically conductive layer on the first pixel defining layer and the electrically conductive layer in the pixel region defined by the first pixel defining layer are isolated from each other, thereby the pattern of the anode 14 is formed in the pixel region and the pattern of the auxiliary cathode 15 is formed on the first pixel defining layer.

In this embodiment, the first transparent electrically conductive layer, the metal layer and the second transparent electrically conductive layer may be sequentially deposited by a sputtering method. The first transparent electrically conductive layer has a thickness $d_{A1}$ of 5 to 20 nm, the metal layer has a thickness $d_{A2}$ of 130 to 170 nm, and the second transparent electrically conductive layer has a thickness $d_{A3}$ of 5 to 20 nm. As an example, the thickness $d_{A1}$ of the first transparent electrically conductive layer is 5 to 10 nm, the thickness $d_{A2}$ of the metal layer is 150 nm, and the thickness $d_{A3}$ of the second transparent electrically conductive layer is 5 to 10 nm. The first transparent electrically conductive layer and the second transparent electrically conductive layer may be made of Indium Tin Oxide (ITO), Indium Zinc Oxide (IZO), or the like. The metal layer may be made of one of magnesium (Mg), silver (Ag), aluminum (Al), copper (Cu), lithium (Li), and the like, or an alloy of the above metal materials, such as magnesium alloy (MgxAg(1-x)), lithium alloy (LixAl(1-x), LixCa(1-x), LixAg(1-x)) and so on.

Figure 4:
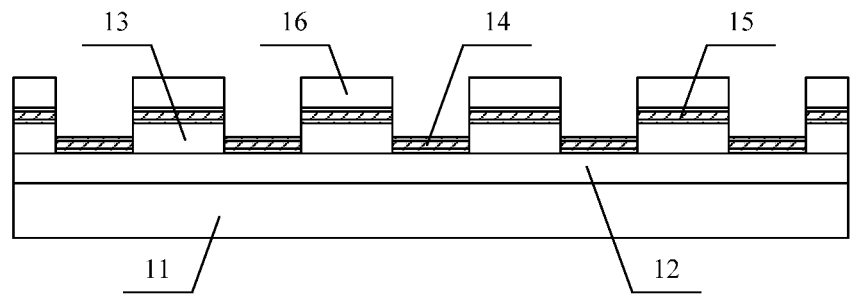
FIG. 4 is a schematic view of a structure with a pattern of a second pixel defining layer formed in a method for manufacturing an organic light emitting diode substrate according to an embodiment of the present disclosure.

(4) A pattern of a second pixel defining layer 16 is formed on the base substrate on which the aforementioned patterns have been formed, the pattern of the second pixel defining layer 16 is the same as the pattern of the first pixel defining layer 13. That is, an orthographic projection of the second pixel defining layer 16 on the base substrate 11 overlaps with an orthographic projection of the first pixel defining layer 13 on the base substrate 11, as shown in FIG. 4. In this embodiment, the manner of forming the second pixel defining layer is the same as the manner of forming the first pixel defining layer, therefore it will not be described herein again.

Figure 5:
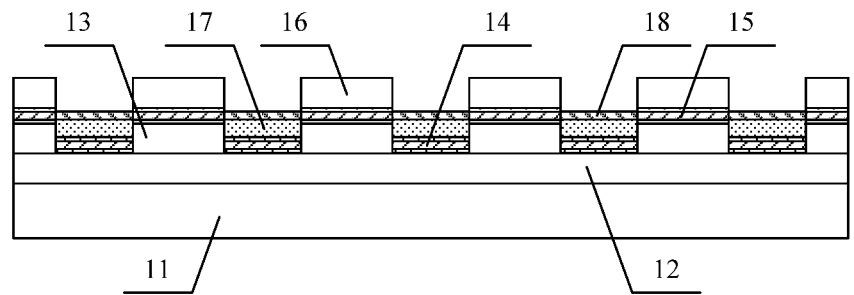
FIG. 5 is a schematic view of a structure with patterns of an organic light emitting diode functional layer and a cathode formed in a method for manufacturing an organic light emitting diode substrate according to an embodiment of the present disclosure.

(5) Patterns of an organic light emitting diode functional layer 17 and a cathode 18 are formed on the base substrate on which the aforementioned patterns have been formed. The patterns of the organic light emitting diode functional layer 17 and the cathode 18 are both formed in the pixel region defined by the patterns of the first pixel defining layer 13 and the second pixel defining layer 16, and the cathode 18 is connected to the auxiliary cathode 15, as shown in FIG. 5. As an example, the cathode 18 is connected to the metal layer of the auxiliary cathode 15. The cathode 18 has a thickness of 6 to 10 nm. As an example, the thickness of the cathode 18 is 8 nm. In this embodiment, the functional layer and the organic light emitting layer of the organic light emitting diode functional layer may be manufactured by coating, spin-coating or ink-jet printing, and the cathode may be manufactured by vacuum evaporation.

In this embodiment, the organic light emitting diode functional layer 17 includes a hole injection layer (HIL), a hole transport layer (HTL), an electron blocking layer (EBL), an organic light emitting layer (EML), a hole blocking layer (HBL), an electron transport layer (ETL) and an electron injection layer (EIL). The organic light emitting layer includes a red light emitting layer (REML), a green light emitting layer (GEML), and a blue light emitting layer (BEML). In an actual implementation, the organic light emitting diode functional layer may also be arranged in other structural forms, and the light emitting layer may also be composed of light emitting layers with other colors, and they will not be specifically limited herein. The cathode may be made of one of magnesium (Mg), silver (Ag), aluminum (Al), copper (Cu), lithium (Li), and the like, or an alloy of the above metal materials, such as magnesium alloy (MgxAg(1-x)), lithium alloy (LixAl(1-x), LixCa(1-x), LixAg(1-x)) and so on.

Figure 6:
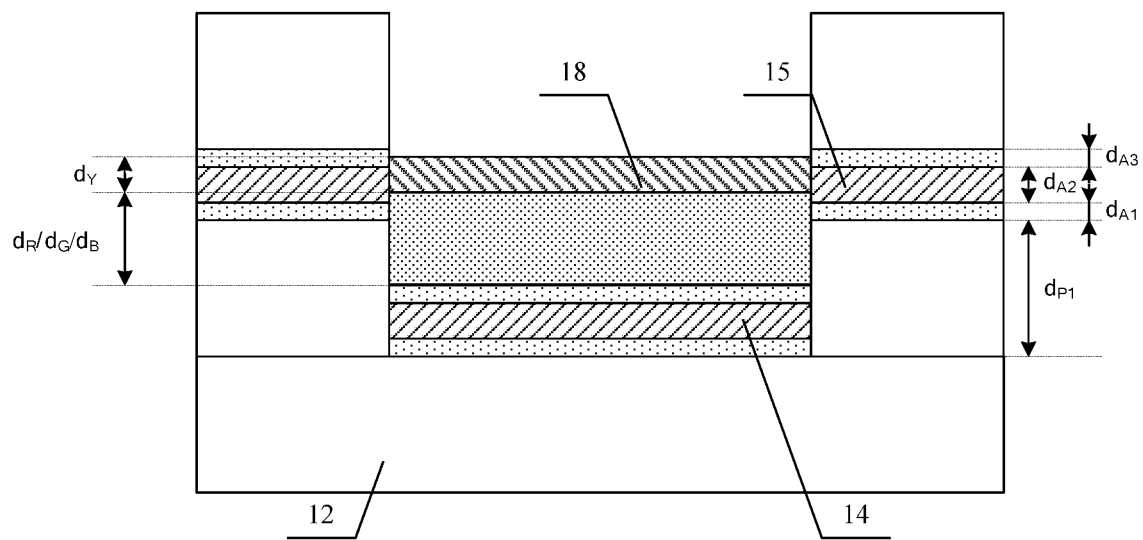
FIG. 6 is an enlarged view of a pixel region in the structure of FIG. 5.

In this embodiment, in order to realize the connection of the cathode 18 and the auxiliary cathode 15, the thicknesses of various film layers in the organic light emitting diode functional layer needs to satisfy some relevant conditions. FIG. 6 is an enlarged view of a pixel region in the structure of FIG. 5, illustrating the thicknesses of the various film layers. Herein, $d_{P1}$ is the thickness of the first pixel defining layer, $d_Y$ is the thickness of the cathode, the thickness $d_Z$ of the anode 14 and the thickness $d_Z$ of the auxiliary cathode 15 are each equal to $d_{A1}+d_{A2}+d_{A3}$, where $d_{A1}$ is the thickness of the first transparent electrically conductive layer, $d_{A2}$ is the thickness of the metal layer, and $d_{A3}$ is the thickness of the second transparent electrically conductive layer. $d_R$, $d_G$, $d_B$ are respectively the thicknesses of the red, green, and blue organic light emitting diode functional layers. The thickness $d_R$ of the red organic light emitting diode functional layer=the thickness of the hole injection layer (HIL)+the thickness of the hole transport layer (HTL)+the thickness of the electron blocking layer (EBL)+the thickness of the red light emitting layer (REML)+the thickness of the hole blocking layer (HBL)+the thickness of the electron transport layer (ETL)+the thickness of the electron injection layer (EIL). The thickness $d_G$ of the green organic light emitting diode functional layer=the thickness of the hole injection layer (HIL)+the thickness of the hole transport layer (HTL)+ the thickness of the electron blocking layer (EBL)+the thickness of the green light emitting layer (GEML)+the thickness of the hole blocking layer (HBL)+the thickness of the electron transport layer (ETL)+the thickness of the electron injection layer (EIL). The thickness $d_B$ of the blue organic light emitting diode functional layer=the thickness of the hole injection layer (HIL)+the thickness of the hole transport layer (HTL)+the thickness of the electron blocking layer (EBL)+the thickness of the blue light emitting layer (BEML)+the thickness of the hole blocking layer (HBL)+ the thickness of the electron transport layer (ETL)+the thickness of the electron injection layer (EIL).

In this embodiment, the various film layers need to satisfy the following conditions:
① $d_Z+d_B+d_Y>d_{P1}$;
That is, $d_B>d_{P1}-d_Z-d_Y=d_{P1}-d_{A1}-d_{A2}-d_{A3}-d_Y$.
② $d_Z+d_R<d_{P1}+d_Z$, that is, $d_R<d_Y$.
③ $d_R>d_G>d_B$.

As an example, the various film layers need to satisfy the following conditions:
① $d_Z+d_B>d_{P1}+d_{A1}$, that is, $d_B>d_{P1}+d_{A1}-d_Z=d_{P1}-d_{A1}-d_{A2}-d_{A3}$.
② $d_Z+d_R+d_Y<d_{P1}+d_Z$, that is, $d_R<d_{P1}-d_Y$.
③ $d_R>d_G>d_B$.

Further, as an example, in order to realize the connection of the cathode 18 and the metal layer of the auxiliary cathode 15, the various film layers need to satisfy the following conditions:
① $d_Z+d_B>d_{P1}+d_{A1}$, that is, $d_B>d_{P1}+d_{A1}-d_Z=d_{P1}-d_{A2}-d_{A3}$.
② $d_Z+d_R+d_Y<d_{P1}+d_{A1}+d_{A2}$, that is, $d_R<d_{P1}+d_{A1}+d_{A2}-d_Z-d_Y=d_{P1}-d_{A3}-d_Y$.
③ $d_R>d_G>d_B$.

In an actual implementation, the thicknesses of the various film layers in this embodiment may be set according to the following table:

|  | $d_{P1}$ | $d_{A1}$ | $d_{A2}$ | $d_{A3}$ | EML | $d_Y$ |
|---|---|---|---|---|---|---|
| $d_B$ | 330 nm | 7 nm | 150 nm | 7 nm | 200 nm | 8 nm |
| $d_G$ |  |  |  |  | 250 nm |  |
| $d_R$ |  |  |  |  | 300 nm |  |

The thicknesses of the red, green and blue light emitting layers may be set according to the following table:

|  | HIL | HTL | EBL | EML | HBL | ETL | EIL |
|---|---|---|---|---|---|---|---|
| $d_B$ | 10 nm | 115 nm | 10 nm | 20 nm | 10 nm | 30 nm | 5 nm |
| $d_G$ |  |  | 50 nm | 30 nm |  |  |  |
| $d_R$ |  |  | 90 nm | 40 nm |  |  |  |

Figure 7:
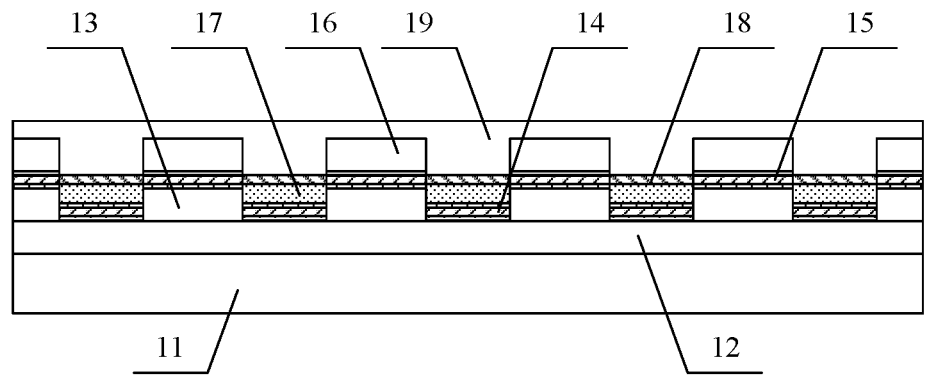
FIG. 7 is a schematic view of a structure with a pattern of an encapsulation layer formed in a method for manufacturing an organic light emitting diode substrate according to an embodiment of the present disclosure.

(6) An encapsulation material is applied to the base substrate on which the aforementioned patterns have been formed to form an encapsulation layer 19, as shown in FIG. 7.

In an actual implementation, a light extraction layer (e.g., circular polarizer layer (CPL)) may be formed on the cathode, and the light extraction layer has a thickness of 50 to 70 nm. As an example, the thickness of the light extraction layer is 60 nm.

It can be seen from the above manufacturing processes that, in the structure of the organic light emitting diode substrate according to this embodiment, a relatively thick auxiliary cathode is formed between two pixel defining layers, a relatively thin cathode is formed in the pixel region, and the cathode is connected to the auxiliary cathode. Since the cathode in the pixel region is relatively thin, the light transmittance is high, and the color shift associated with viewing angle is effectively suppressed. The auxiliary cathode between the two pixel defining layers is relatively thick, thus the resistance is small, which not only avoids voltage and power consumption increase, but also contributes to a uniform voltage distribution across the cathode in the various pixel regions, thereby resulting in a high brightness uniformity. In a prior structure, the cathode is usually composed of a monolithic film structure. Since the film is thin and the resistance is large, it is necessary for peripheral driving circuit to apply a high voltage, so as to ensure the voltage of the cathode located in a central display region. Furthermore, since the pixel regions are located at different positions, the voltages on the cathodes are also different, resulting in non-uniform voltage distribution. In this embodiment, by providing an auxiliary cathode with a larger thickness, it functions as a transmission line for directing the voltage of the peripheral driving circuit to the vicinity of each cathode and then transmitting it to the cathode, therefore the voltages on the cathodes are completely the same, and the voltage distribution is uniform, thereby a higher brightness uniformity is achieved. Meanwhile, the voltage and power consumption increase is avoided. Since the auxiliary cathode functioning as a transmission line is provided, the cathode may be set to be thin, and therefore the light transmittance can be maximized, thereby the color shift associated with viewing angle can be improved as far as possible. Therefore, compared with the conventional structure, this embodiment simultaneously improves the light transmittance and the electrical conductivity of the OLED.

In this embodiment, although it needs to manufacture the pixel defining layers twice, only one mask is needed. The manufacturing of other layers is similar to the prior art. Therefore, the manufacturing method of this embodiment has less modification to the existing process, and it has simple processes, it is easy to be implemented, and has a good application prospect.

The organic light emitting diode substrate manufactured by the manufacturing method of this embodiment includes:
 a base substrate 11;
 a driving structure layer 12 disposed on the base substrate 11;
 a pixel defining layer disposed on the driving structure layer 12 and configured to define a pixel region, wherein the pixel defining layer includes a first pixel defining layer 13, a auxiliary cathode 15 and a second pixel defining layer 16 which are sequentially stacked;

an anode 14 disposed in the pixel region;

an organic light emitting diode functional layer 17 disposed on the anode 14;

a cathode 18 disposed on the organic light emitting diode functional layer 17, the cathode 18 being connected to the auxiliary cathode 15;

an encapsulation layer 19 covering the above patterns.

The anode 14 and the auxiliary cathode 15 have the same structural layers, and they each include a first transparent electrically conductive layer having a thickness of 5 to 20 nm, a metal layer having a thickness of 130 to 170 nm, and a second transparent electrically conductive layer having a thickness of 5 to 20 nm. As an example, the anode 14 and the auxiliary cathode 15 are formed in one and the same process, and the cathode 18 is connected to the metal layer of the auxiliary cathode 15.

The first pixel defining layer has a thickness of 300 to 350 nm, and a slope angle of an edge of the first pixel defining layer 13 and a slope angle of an edge of the second pixel defining layer 16 are 85° to 90°. The cathode has thickness of 6 to 10 nm.

The organic light emitting diode functional layer includes a red organic light emitting diode functional layer having a thickness of $d_R$, a green organic light emitting diode functional layer having a thickness of $d_G$, and a blue organic light emitting diode functional layer having a thickness of $d_B$, and $d_B > d_{P1} - d_{P1} - d_{A1} - d_{A3} - d_Y$; $d_R < d_{P1}$; $d_R > d_G > d_B$, where $d_{P1}$ is a thickness of the first pixel defining layer, $d_{A1}$ is a thickness of the first transparent electrically conductive layer, $d_{A2}$ is a thickness of the metal layer, $d_{A3}$ is a thickness of the second transparent electrically conductive layer, and $d_Y$ is a thickness of the cathode.

In an actual implementation, the driving structure layer includes thin film transistors disposed on the base substrate. Drain electrodes of the thin film transistors are electrically connected to the anode. The thin film transistors may be switched on row by row by means of gate scanning signal. Data voltages may be transmitted from the thin film transistors to the anode, and the anode and the cathode cooperate to form a voltage difference that drives the organic light emitting layer to emit light, thereby achieving autonomous light emission.

Figure 8:
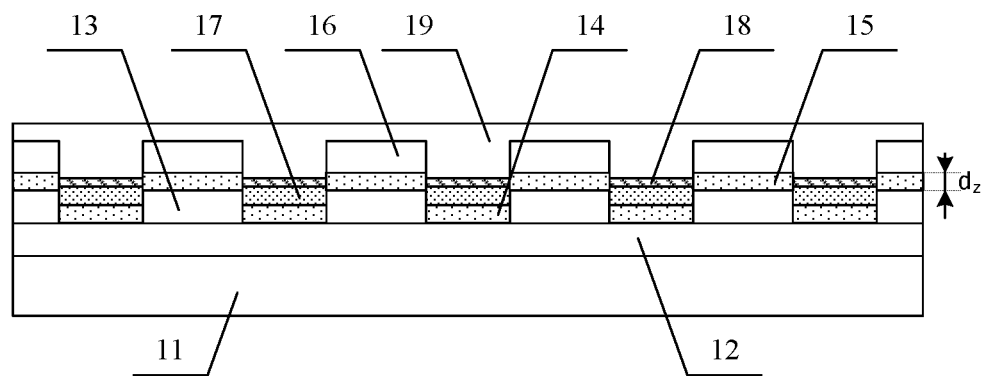
FIG. 8 is a schematic structural view of an organic light emitting diode substrate according to an embodiment of the present disclosure.

FIG. 8 is a schematic structural view of an organic light emitting diode substrate according to another embodiment of the present disclosure. The main structure of the organic light emitting diode substrate according to this embodiment is the same as those of the embodiments described above, except that the anode 14 and the auxiliary cathode 15 of this embodiment are formed of only a transparent electrically conductive layer having a thickness of 140 to 210 nm. As an example, the thickness of the transparent electrically conductive layer is 160 to 170 nm.

The processes of manufacturing the organic light emitting diode substrate in this embodiment are also similar to those of the embodiments described above, except that the transparent electrically conductive layer is deposited by sputtering after the pattern of the first pixel defining layer is manufactured, to form the pattern of the anode 14 in the pixel region and the pattern of the auxiliary cathodes 15 on the first pixel defining layer, and the anode 14 and the auxiliary cathode 15 only include the transparent electrically conductive layer.

The material, the thickness, and the thickness relationship of various film layers may refer to the embodiments described above, and they will not be described herein again.

The organic light emitting diode substrate manufactured by the manufacturing method of this embodiment includes:

a base substrate 11;

a driving structure layer 12 disposed on the base substrate 11;

a pixel defining layer disposed on the driving structure layer 12 and configured to define a pixel region, wherein the pixel defining layer includes a first pixel defining layer 13, an auxiliary cathode 15 and a second pixel defining layer 16 which are sequentially stacked;

an anode 14 disposed in the pixel region;

an organic light emitting diode functional layer 17 disposed on the anode 14;

a cathode 18 disposed on the organic light emitting diode functional layer 17, the cathode 18 being connected to the auxiliary cathode 15;

an encapsulation layer 19 covering the above patterns.

The anode 14 and the auxiliary cathode 15 have the same structural layer, and they each include a transparent electrically conductive layer having a thickness of 140 to 210 nm. As an example, the anode 14 and the auxiliary cathode 15 are formed in one and the same process.

The first pixel defining layer has a thickness of 300 to 350 nm, and a slope angle of an edge of the first pixel defining layer 13 and a slope angle of an edge of the second pixel defining layer 16 are 85° to 90°. The cathode has the thickness of 6 to 10 nm.

The organic light emitting diode functional layer includes a red organic light emitting diode functional layer having a thickness of $d_R$, a green organic light emitting diode functional layer having a thickness of $d_G$, and a blue organic light emitting diode functional layer having a thickness of $d_B$, and $d_B > d_{P1} - d_Z - d_Y$; $d_R < d_{P1}$; $d_R > d_G > d_B$, where $d_{P1}$ is a thickness of the first pixel defining layer, $d_Z$ is a thickness of the transparent electrically conductive layer, and $d_Y$ is a thickness of the cathode.

An embodiment of the present disclosure provides a display panel with a top-emitting structure, including the organic light emitting diode substrate according to the embodiments described above. The display panel may be any product or component having a display function such as a mobile phone, a tablet computer, a television, a monitor, a notebook computer, a digital photo frame, a navigator, and the like.

Further, an embodiment of the present disclosure provides a display device including the display panel according to the embodiments described above.

In the organic light emitting diode substrate, the method for manufacturing the organic light emitting diode substrate and the display panel according to the embodiments of the present disclosure, an auxiliary cathode is formed between two pixel defining layers, a cathode is formed in the pixel region, and the cathode is connected to the auxiliary cathode. In this way, it not only effectively improves the color shift associated with viewing angle, but also makes voltage distribution of the cathode uniform, thereby resulting in a high brightness uniformity. Therefore, the light transmittance and the electrical conductivity of the OLED are improved.

In the description of the embodiments of the present disclosure, it is to be understood that the terms "middle", "upper", "lower", "front", "rear", "vertical", "horizontal", "top", "inner", "outer", and other terms for indicating orientation or positional relationship are based on the orientation or positional relationship shown in the drawings, and they are merely used for convenience and simplification of the description of the present disclosure, rather than indicating or implying that the device or component in question must be arranged in a particular orientation or constructed and operated in a particular orientation, therefore they should not be construed as limiting the present disclosure.

In the description of the embodiments of the present disclosure, it should be noted that the terms "install", "connect", and "couple" should be understood broadly, for example, they may refer to a fixed connection, a detachable connection, or an integral connection; they may refer to a mechanical connection or an electrical connection; or they may refer to a direct connection, or a indirect connection with an intermediate medium, also they may refer to an internal communication between two elements. The specific meanings of the above terms in the present disclosure can be understood in specific circumstances by those skilled in the art.

The embodiments disclosed in the present disclosure are as described above, but they are merely used to facilitate the understanding of the present disclosure, but not intended to limit the present disclosure. Any modifications and variations may be made by those skilled in the art in form and detail without departing from the spirit and scope of the present disclosure. The scope of the present disclosure should be defined by the appended claims and equivalents thereof.

What is claimed is:

1. An organic light emitting diode substrate, comprising:
   a base substrate;
   a pixel defining layer on the base substrate; and
   an anode, an organic light emitting diode functional layer and a cathode in a pixel region,
   wherein the pixel defining layer comprises a first pixel defining layer, an auxiliary cathode and a second pixel defining layer sequentially stacked, the auxiliary cathode being connected to the cathode, and
   wherein the anode and the auxiliary cathode are formed in one same process.

2. The organic light emitting diode substrate according to claim 1, wherein a thickness of the cathode is less than a thickness of the auxiliary cathode.

3. The organic light emitting diode substrate according to claim 1, wherein the cathode has a thickness of 6 to 10 nm.

4. The organic light emitting diode substrate according to claim 1, wherein the auxiliary cathode comprises a first transparent electrically conductive layer, a metal layer, and a second transparent electrically conductive layer sequentially stacked.

5. The organic light emitting diode substrate according to claim 4, wherein the first transparent electrically conductive layer has a thickness of 5 to 20 nm, the metal layer has a thickness of 130 to 170 nm, and the second transparent electrically conductive layer has a thickness of 5 to 20 nm.

6. The organic light emitting diode substrate according to claim 4, wherein the organic light emitting diode functional layer comprises a red organic light emitting diode functional layer having a thickness of $d_R$, a green organic light emitting diode functional layer having a thickness of $d_G$, and a blue organic light emitting diode functional layer having a thickness of $d_B$, and $d_B > d_{P1} - d_{A1} - d_{A2} - d_{A3} - d_Y$; $d_R < d_{P1}$; $d_R > d_G > d_B$,
   where $d_{P1}$ is a thickness of the first pixel defining layer, $d_{A1}$ is a thickness of the first transparent electrically conductive layer, $d_{A2}$ is a thickness of the metal layer, $d_{A3}$ is a thickness of the second transparent electrically conductive layer, and $d_Y$ is a thickness of the cathode.

7. The organic light emitting diode substrate according to claim 1, wherein the auxiliary cathode is formed from a transparent electrically conductive layer.

8. The organic light emitting diode substrate according to claim 7, wherein the transparent electrically conductive layer has a thickness of 160 to 170 nm.

9. The organic light emitting diode substrate according to claim 7, wherein the organic light emitting diode functional layer comprises a red organic light emitting diode functional layer having a thickness of $d_R$, a green organic light emitting diode functional layer having a thickness of $d_G$, and a blue organic light emitting diode functional layer having a thickness of $d_B$, and $d_B > d_{P1} - d_Z - d_Y$; $d_R < d_{P1}$; $d_R > d_G > d_B$,
   where $d_{P1}$ is a thickness of the first pixel defining layer, $d_Z$ is a thickness of the transparent electrically conductive layer, and $d_Y$ is a thickness of the cathode.

10. The organic light emitting diode substrate according to claim 1, wherein the first pixel defining layer has a thickness of 300 to 350 nm, and a slope angle of an edge of the first pixel defining layer and a slope angle of an edge of the second pixel defining layer are 85° to 90°.

11. A display panel, comprising the organic light emitting diode substrate according to claim 1.

12. A method for manufacturing an organic light emitting diode substrate, comprising:
   forming a first pixel defining layer on a base substrate;
   forming an auxiliary cathode on the first pixel defining layer and forming an anode in a pixel region defined by the first pixel defining layer;
   forming a second pixel defining layer on the auxiliary cathode; and
   forming an organic light emitting diode functional layer and a cathode on the anode, the cathode being connected to the auxiliary cathode,
   wherein the anode and the auxiliary cathode are formed by one same process.

13. The method according to claim 12, wherein the formed cathode has a thickness less than a thickness of the auxiliary cathode.

14. The method according to claim 12, wherein forming the first pixel defining layer on the base substrate comprises: depositing a pixel defining film on the base substrate; and exposing, developing and etching the pixel defining film to form the first pixel defining layer, and
   wherein the first pixel defining layer has a thickness of 300 nm to 350 nm, and an edge of the first pixel defining layer has a slope angle of 85° to 90°.

15. The method according to claim 12, wherein forming the auxiliary cathode on the first pixel defining layer and forming the anode in the pixel region defined by the first pixel defining layer comprises:
   depositing a first transparent electrically conductive layer, a metal layer, and a second transparent electrically conductive layer sequentially on the first pixel defining layer and the pixel region defined by the first pixel defining layer to form the auxiliary cathode on the first pixel defining layer and the anode in the pixel region defined by the first pixel defining layer.

16. The method according to claim 15, wherein forming the organic light emitting diode functional layer and the cathode on the anode comprises:
   forming a red organic light emitting diode functional layer having a thickness of $d_R$, a green organic light emitting diode functional layer having a thickness of $d_G$, and a blue organic light emitting diode functional layer having a thickness of $d_B$ respectively on the anode in different pixel regions, and $d_B > d_{P1} - d_{A1} - d_{A2} - d_{A3} - d_Y$; $d_R < d_{P1}$; $d_R > d_G > d_B$, where $d_{P1}$ is a thickness of the first pixel defining layer, $d_{A1}$ is a thickness of the first transparent electrically conductive layer, $d_{A2}$ is a thickness of the metal layer, $d_{A3}$ is a thickness of the second transparent electrically conductive layer, and $d_Y$ is a thickness of the cathode.

17. The method according to claim 12, wherein forming the auxiliary cathode on the first pixel defining layer and forming the anode in the pixel region defined by the first pixel defining layer comprises:

depositing a transparent electrically conductive layer on the first pixel defining layer and the pixel region defined by the first pixel defining layer to form the auxiliary cathode on the first pixel defining layer and the anode in the pixel region defined by the first pixel defining layer.

18. The method according to claim 17, wherein forming the organic light emitting diode functional layer and the cathode on the anode comprises:

forming a red organic light emitting diode functional layer having a thickness of $d_R$, a green organic light emitting diode functional layer having a thickness of $d_G$, and a blue organic light emitting diode functional layer having a thickness of $d_B$ respectively on the anode in different pixel regions, and $d_B > d_{P1} - d_Z - d_Y$; $d_R < d_{P1}$; $d_R > d_G > d_B$, where $d_{P1}$ is a thickness of the first pixel defining layer, $d_Z$ is a thickness of the transparent electrically conductive layer, and $d_Y$ is a thickness of the cathode.

* * * * *